(12) United States Patent  (10) Patent No.: US 7,719,855 B2
Berke et al.  (45) Date of Patent: May 18, 2010

(54) SPACING DEVICE FOR MODULAR SYSTEM

(75) Inventors: Stuart Allen Berke, Austin, TX (US);
Jeffrey Michael Lewis, Maynard, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 911 days.

(21) Appl. No.: 11/513,849

(22) Filed: Aug. 31, 2006

(65) Prior Publication Data
US 2008/0055877 A1   Mar. 6, 2008

(51) Int. Cl.
*H05K 7/12* (2006.01)

(52) U.S. Cl. ............... 361/804; 361/742; 361/758; 361/770; 361/756; 361/801; 174/138 E; 174/138 G

(58) Field of Classification Search ......... 361/741, 361/756, 758, 802, 770, 804, 742; 174/138 E, 174/138 G
See application file for complete search history.

(56) References Cited

U.S. PATENT DOCUMENTS

| 4,068,290 | A | * | 1/1978 | Wetherbee | 361/802 |
| 4,669,616 | A | * | 6/1987 | Mazura | 211/41.17 |
| 5,818,696 | A | * | 10/1998 | Knoop | 361/730 |
| 6,008,995 | A | * | 12/1999 | Pusateri et al. | 361/796 |
| 6,309,237 | B1 | * | 10/2001 | Longueville | 439/267 |
| 6,580,616 | B2 | * | 6/2003 | Greenside et al. | 361/752 |
| 7,254,025 | B2 | * | 8/2007 | Baldwin, Jr. | 361/700 |

OTHER PUBLICATIONS

Berke et al., U.S. Appl. No. 11/513,807, filed August 31, 2006, entitled "Mounting Adapter for Electronic Modules.".

* cited by examiner

*Primary Examiner*—Dameon E Levi

(57) ABSTRACT

A spacing device for adapting electronic modules for insertion into a system is disclosed. In one embodiment, the spacing device includes a body and guide features configured to align the body with mating guide features of electronic modules. The spacing device also includes a coupling portion having coupling arms, which is configured to secure the electronic modules to the body.

21 Claims, 6 Drawing Sheets

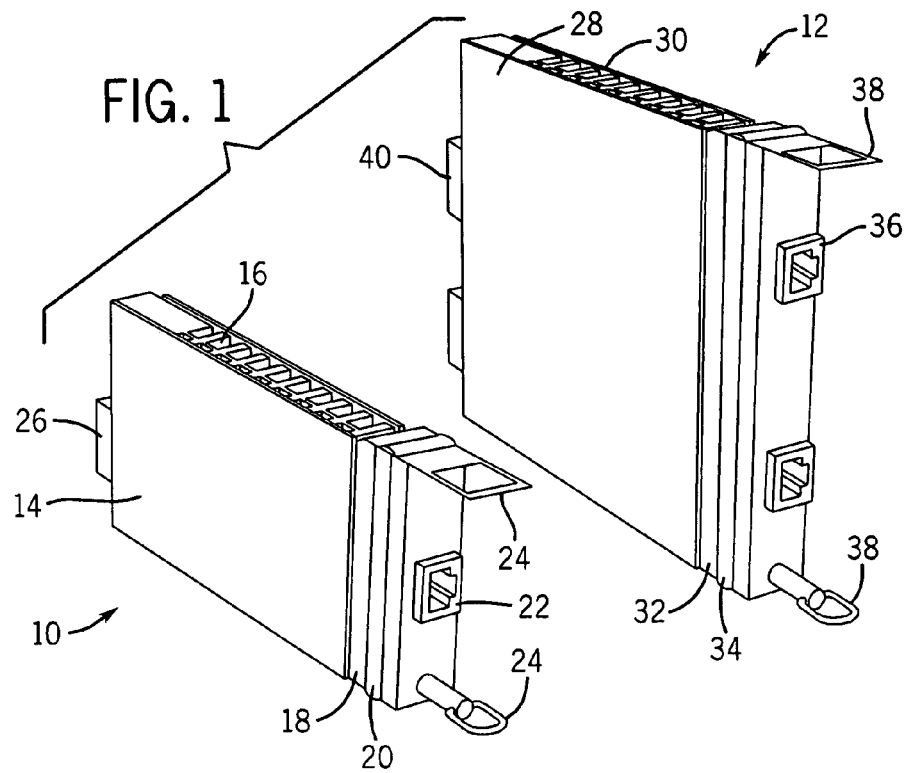
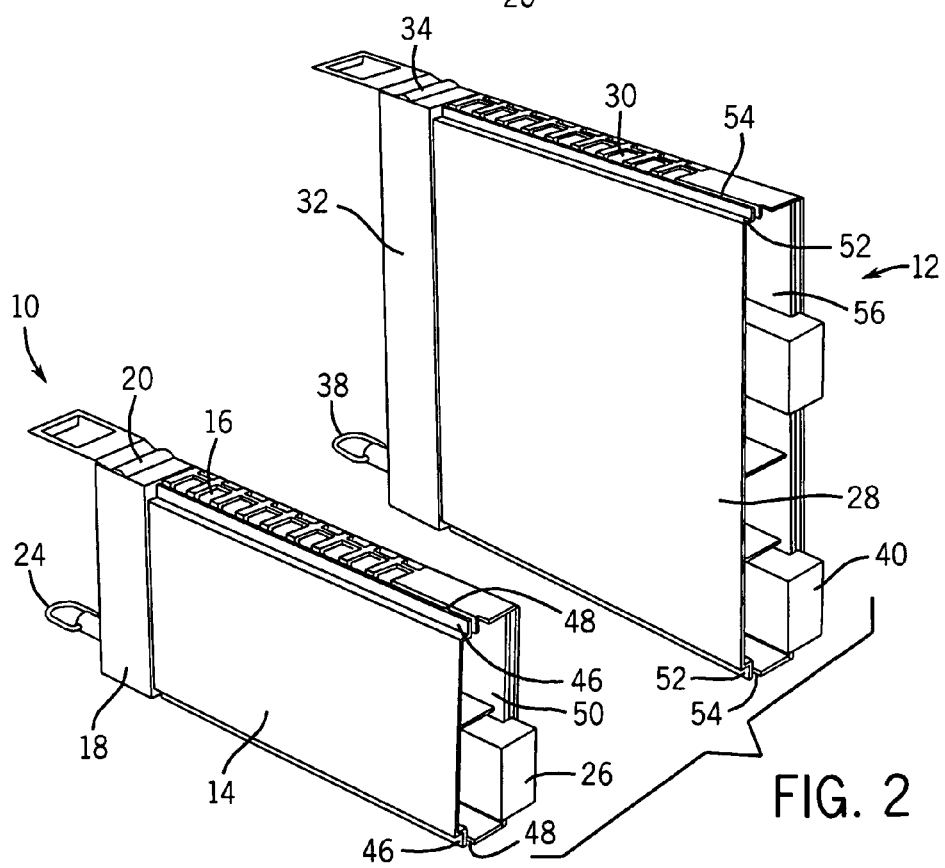

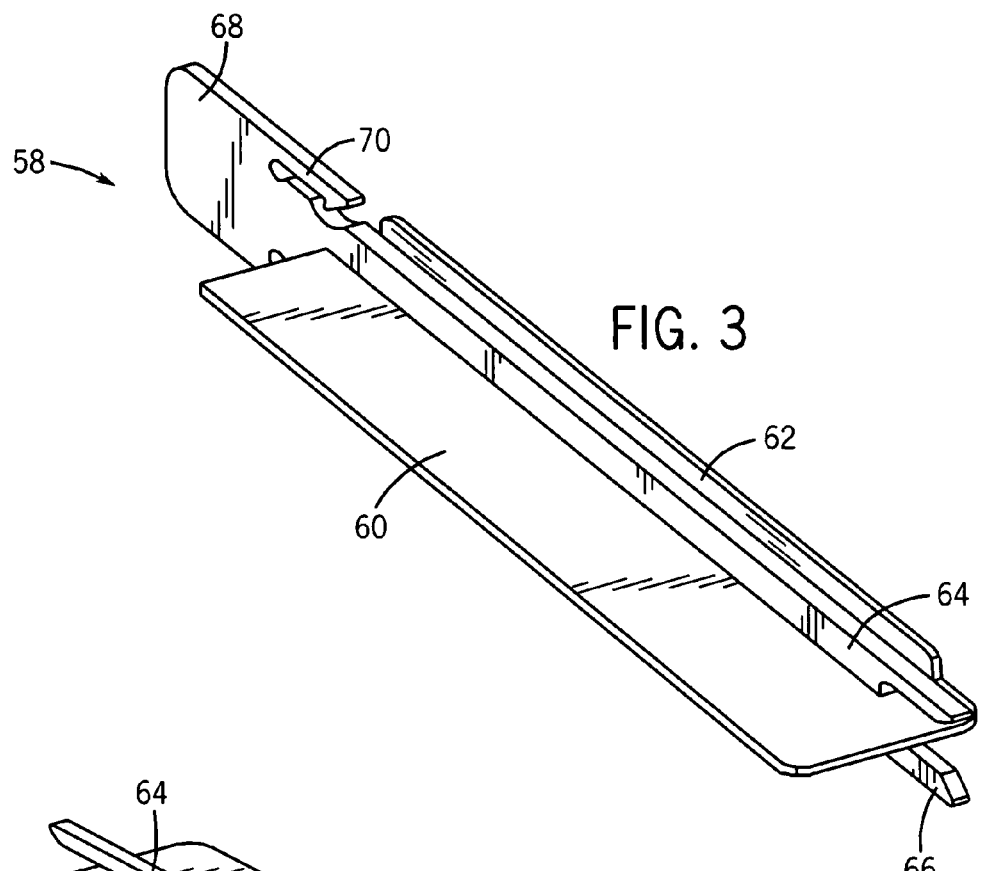
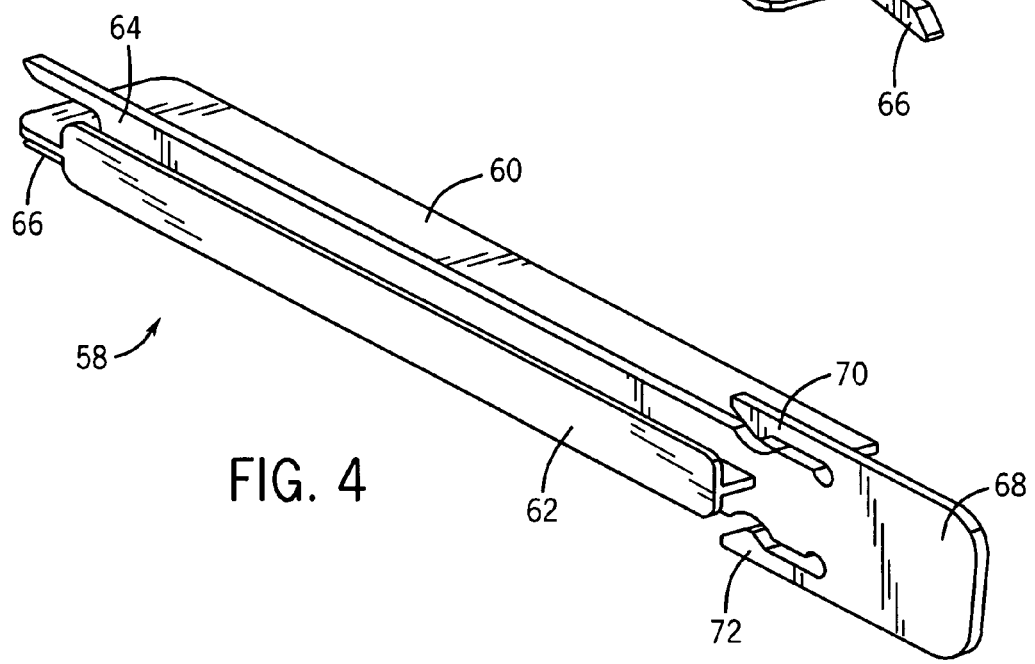

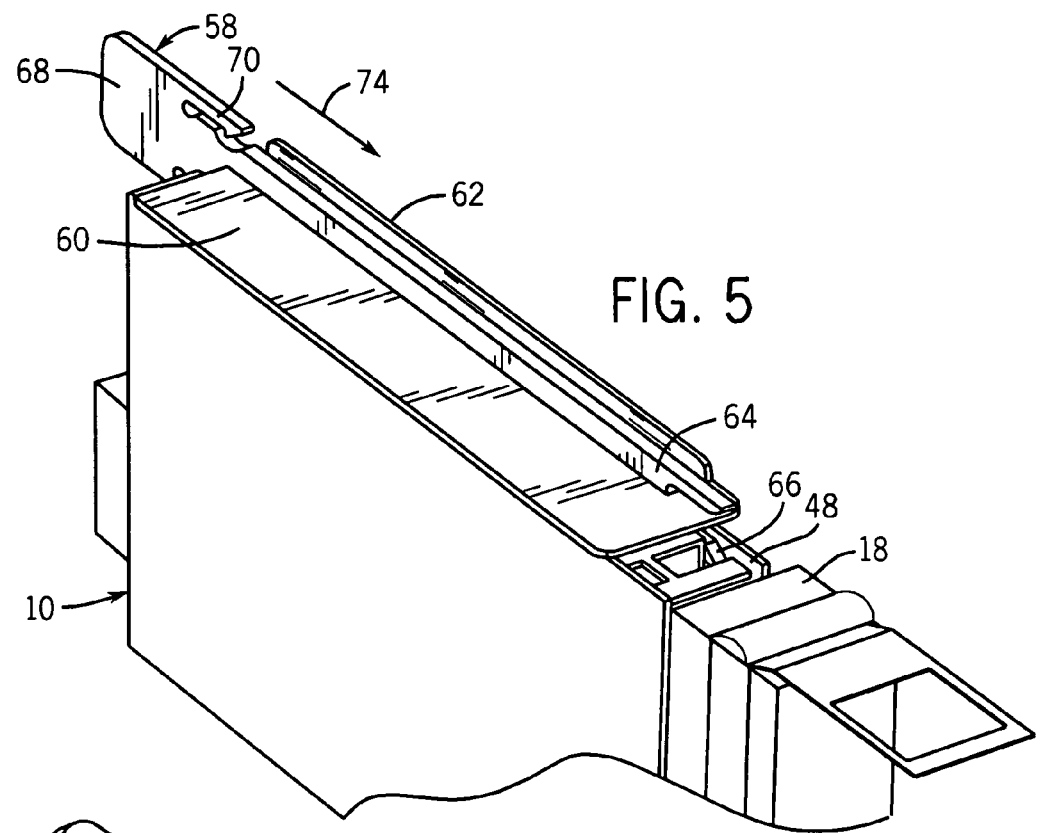
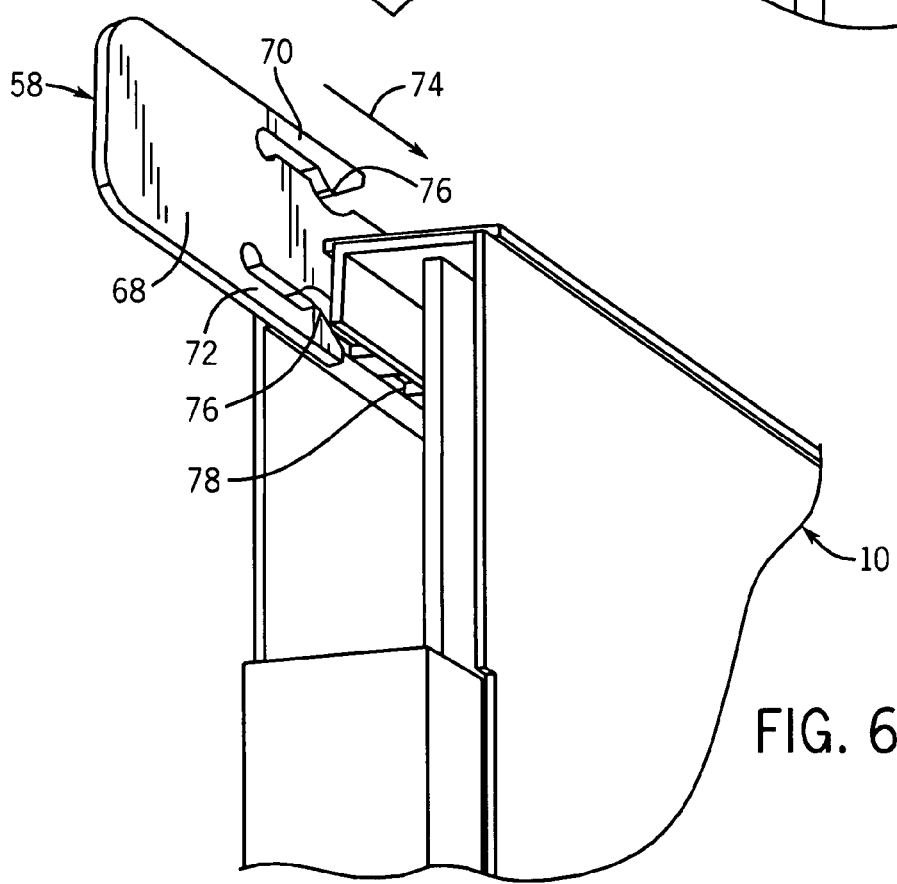

SPACING DEVICE FOR MODULAR SYSTEM

BACKGROUND

This section is intended to introduce the reader to various aspects of art, which may be related to various aspects of the present invention that are described or claimed below. This discussion is believed to be helpful in providing the reader with background information to facilitate a better understanding of the various aspects of the present invention. Accordingly, it should be understood that these statements are to be read in this light, and not as admissions of prior art.

Businesses and individuals use computing devices, such as servers, in a wide range of applications. Use of these devices has become increasingly common and each generation of computing devices is seemingly more advanced than the previous generation. However, this technological advance is generally accompanied by a corresponding increase in the complexity of these devices. As the number of circuits or components of a device increase, so do the chances that one of these circuits or components will fail, which may ultimately affect operation of the device. Accordingly, many electronic devices are now manufactured in such a manner as to facilitate user removal or installation of various components of an electronic device. This allows a user to not only replace a malfunctioning component of a device, but also allows such a user to customize a device to achieve a desired configuration.

To facilitate ease of removal and installation, a component of a computing server or other electronic device may be enclosed within a cartridge or module. Such an arrangement provides protection for the individual parts of the modular component, while increasing the ease with which the component may be handled. To accommodate these modules, servers may contain cardcages adapted to receive and secure the modules. These cardcages are generally designed with slots that receive modules of a fixed height between the upper and lower portions of the cardcage. While this arrangement may allow certain modules of equal height to be inserted and removed from the cardcage, such cardcages are not designed to accept modules of varying height. As will be appreciated, some components may be less complex than others and, thus, do not necessarily require an enclosure having the same volume as a more complex device. Further, some modules may require a greater number of lanes to communicate with, and operate in, a given server than do other modules. Thus, there is a need for a modular cardcage system that allows utilization of modules of varying heights.

BRIEF DESCRIPTION OF THE DRAWINGS

Advantages of one or more disclosed embodiments may become apparent upon reading the following detailed description and upon reference to the drawings in which:

FIG. 1 is a front perspective view of an exemplary pair of electronic modules in accordance with one embodiment of the present techniques;

FIG. 2 is a rear perspective view of the electronic modules illustrated in FIG. 1;

FIG. 3 is a front perspective view of an exemplary spacing device for coupling two modules together in accordance with one embodiment of the present techniques;

FIG. 4 is a rear perspective view of the spacing device of FIG. 3, which more clearly illustrates certain features of the exemplary spacing device;

FIG. 5 is a front perspective view illustrating the attachment of the spacing devices of FIGS. 3 and 4 to an electronic module in accordance with one embodiment of the present techniques;

FIG. 6 is a rear perspective view further illustrating the attachment of the spacing device to an electronic module as depicted in FIG. 5;

DETAILED DESCRIPTION OF SPECIFIC EMBODIMENTS

Figure 7:
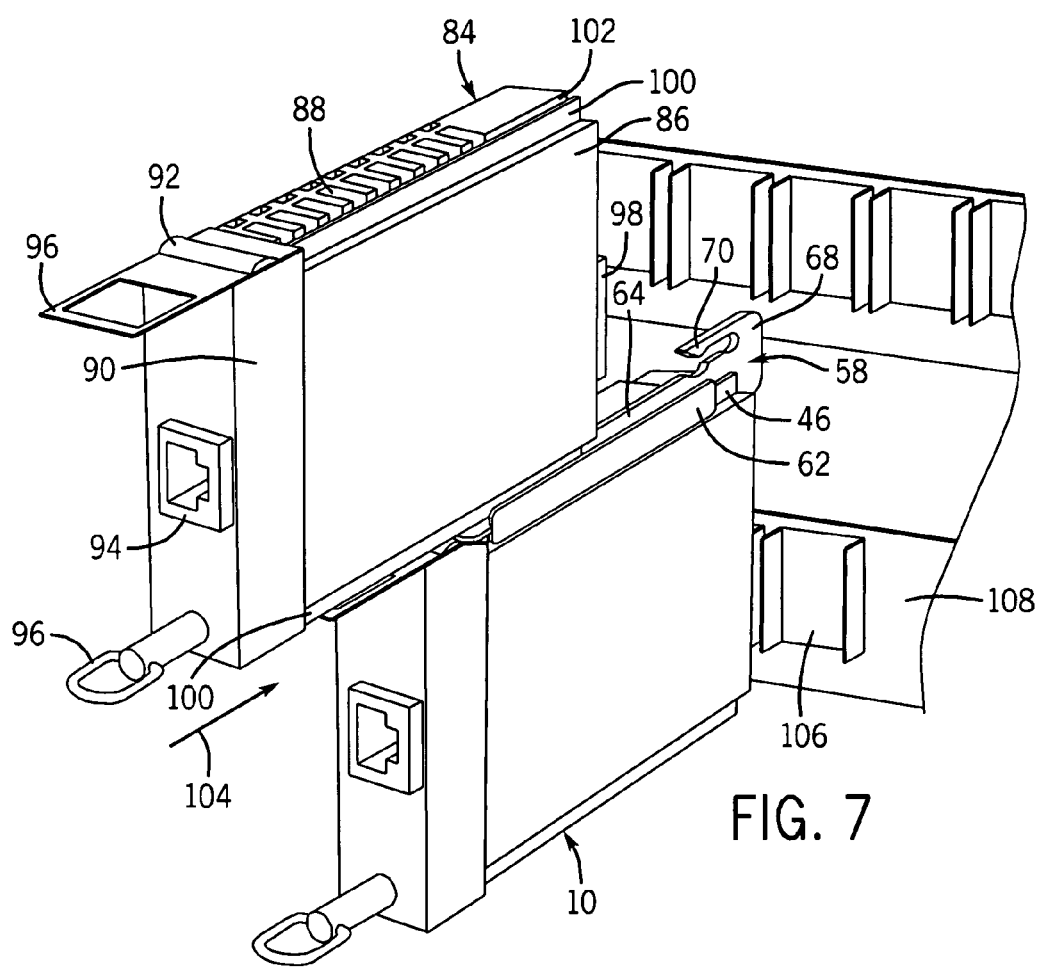
FIG. 7 is a front perspective view illustrating the attachment of a second electronic module to the assembly illustrated in FIGS. 5 and 6 in accordance with one embodiment of the present techniques.

One or more exemplary embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Various embodiments of the present invention are directed to a modular cardcage system that allows modules of various heights and widths to be mounted within a single cardcage. Particularly, the present techniques utilize a spacing device, or spacer, to enable installation of one or more smaller modules in a cardcage slot configured to receive a larger module. In one embodiment, a spacing device is configured for coupling to a pair of electronic modules such that the profile of the spacer and attached modules is substantially similar to that of a larger electronic module, thus allowing the spacer and coupled modules to occupy the slot of the cardcage configured for the larger module. In other embodiments, three or more electronic modules may be stacked one over the other and coupled together between each adjacent pair via the spacing device, wherein the combined height of the three or more modules is substantially the same as a single, larger standard module Turning now to the figures, FIG. 1 illustrates an exemplary pair of electronic modules in accordance with one embodiment of the present techniques. Particularly, certain features of a device or base module 10 and a device or full module 12 are depicted. It should be noted that, while modules of certain embodiments may have PCI Express ExpressModule™ (formerly Server I/O Module (SIOM)) form factors, the present techniques are similarly applicable to other modules or form factors. As used herein, the term "module" refers to an electronic device that plugs into a backplane and has a partially or fully enclosed circuit board. Accordingly, base module 10 includes an enclosure or housing 14 for protecting internal circuitry of the module. In the presently illustrated embodiment, enclosure 14 includes a plurality of apertures or vents 16 that facilitate convective cooling of the internal circuitry.

While apertures, such as apertures 16, generally promote heat transfer away from the internal components, in other embodiments, in which cooling is of lesser concern, enclosures may not have such apertures.

Enclosure 14 may be coupled to a bulkhead 18. In one embodiment, bulkhead 18 is formed from metal to facilitate EMI shielding as discussed below. Alternatively, the bulkhead 18 could also be formed with other materials, such as plastic, ceramic, or the like. Further, in the illustrated embodiment, base module 10 also includes an EMI gasket 20, an input-output connector 22, and latching features 24. As will be appreciated, in various embodiments, latching features 24 may comprise resilient clips, snaps, screws, hooks, tool-free fasteners, or other such structures, in full accordance with the present techniques. The input-output connector 22 facilitates electronic communication between base module 10 and other electronic components. Base module 10 is configured to be connected to a backplane via connector 26, as discussed in greater detail below with respect to FIG. 8.

Full module 12 includes a number of features similar to those found in base module 10. For instance, full module 12 includes an enclosure 28 having ventilation apertures 30, a bulkhead 32, an EMI gasket 34, input-output connectors 36, and latching features 38. Full module 12 also includes one or more backplane connectors 40. Notably, in the presently illustrated embodiment, the height of full module 12 is slightly greater than twice the height of base module 10. These proportions allow two base modules 10 to be coupled to a spacing device for insertion into a slot of a system configured to receive the full module 12, as discussed in further detail below.

It should be noted that, although the presently illustrated modules are communication modules having input-output connectors 22 and 36, the present techniques are not limited to such modules. For instance, other communications modules may contain wireless communication technology, which may replace or supplement physical connectors such as connectors 22 and 36. Indeed, the present techniques are not limited to communication modules, but may be used with any modular system in which modules are plugged into a backplane. For example, other modules that may benefit from the present techniques include processor modules, memory modules, hard drive modules, optical drive modules, USB modules, or the like, in addition to communication modules.

Various additional features of the exemplary modules are illustrated in FIG. 2. As shown therein, base module 10 includes one or more alignment features, such as indentations 46 and grooves 48, and circuit board 50, which supports various circuitry coupled to connector 26. Similarly, full module 12 includes various alignment features, such as indentations 52 and grooves 54, and circuit board 56 for supporting electronic components of the module.

An exemplary spacing device 58 is illustrated in FIGS. 3 and 4 in accordance with certain embodiments of the present techniques. Notably, spacer or spacing device 58 is configured to couple two electronic modules to one another. The spacing device 58 includes a generally planar body 60; a lateral spacing portion 62; alignment and guide features, such as guide ribs 64 and 66; and a coupling extension 68. As may be appreciated, the guide ribs 64 and 66 are configured for insertion into mating grooves of electronic modules, such as base modules 10, thereby facilitating alignment of spacing device 58 and the electronic modules. While the illustrated embodiment utilizes guide ribs 64 and 66, other alignment features may be utilized in accordance with the present techniques. For instance, an alternative spacing device may instead include a plurality of grooves configured to receive guide ribs formed on or attached to the plurality of electronic modules. As discussed in further detail below, coupling extension 68 includes first and second retaining arms 70 and 72, respectively, for coupling the spacing device to various electronic modules, such as base modules 10.

By way of example, FIGS. 5 and 6 illustrate attachment of exemplary spacing device 58 to electronic module 10. Particularly, lower guide rib 66 may be inserted into groove 48 of base module 10 to properly align spacing device 58 and the electronic module 10. To permit coupling of the spacing device 58 to the module 10, the spacing device 58 is slid along module 10 in a direction 74 until one end of guide rib 66 is positioned beneath the bulkhead 18 of base module 10. Further, as illustrated in FIG. 6, such movement causes the coupling extension 68 to engage the module 10. Particularly, retaining arm 72 is brought into contact with the base of groove 48. As the spacer 58 continues in direction 74 the resiliency of retaining arm 72 causes a tab 76 to be inserted in a notch 78 of the electronic module 10, thereby securing spacing device 58 to the electronic module 10. As will be appreciated, while the present embodiment utilizes resilient retaining arms 70 and 72 to effectuate securing of the spacing device 58 to various electronic modules, other coupling mechanisms may be used in accordance with the present techniques, including latches, spring-loaded or hinged arms, and the like.

A second base module 84 may be coupled to base module 10 via spacing device 58, as illustrated in FIG. 7. Second base module 84 may generally include features similar to those of base module 10. As illustrated, base module 84 includes an enclosure 86, one or more cooling vents 88, a bulkhead 90, an EMI gasket 92, an input-output connector 94, latching features 96, and a backplane connector 98. Further, base module 84 includes one or more alignment features, such as indentations 100 and grooves 102 formed on the upper and lower surfaces of base module 84. Base module 84 may be secured to base module 10 and spacing device 58 in a manner similar to that describe above with respect to FIGS. 5 and 6. Particularly, guide rib 64 is inserted in a groove 102 on the lower surface of the base module 84 and then the base module 84 is slidingly moved in the direction indicated by arrow 104. As will be appreciated, the base module 84 will slidably engage the retaining arm 70 of coupling extension 68, thereby retaining base module 84 in a manner similar to that of base module 10. It should be noted that although base modules 10 and 84 are illustrated in FIG. 7, spacing device 58 may be used to couple various electronic modules of different sizes.

As will be appreciated by one skilled in the art, once the apparatus including base modules 10 and 84 and spacing device 58 is assembled, the base modules 10 and 84 may be plugged into ports 106 to connect to a backplane 108. As will also be appreciated, this arrangement allows two base modules with eight-lane signaling to occupy the same space as a full module with sixteen-lane signaling, such as a sixteen-lane PCI Express port that is bifurcatable into two independent eight-lane links. Further, the same techniques are equally applicable with links of other widths, such as a proprietary twenty-lane link that may be divided into two independent ten-lane links.

Figure 8:
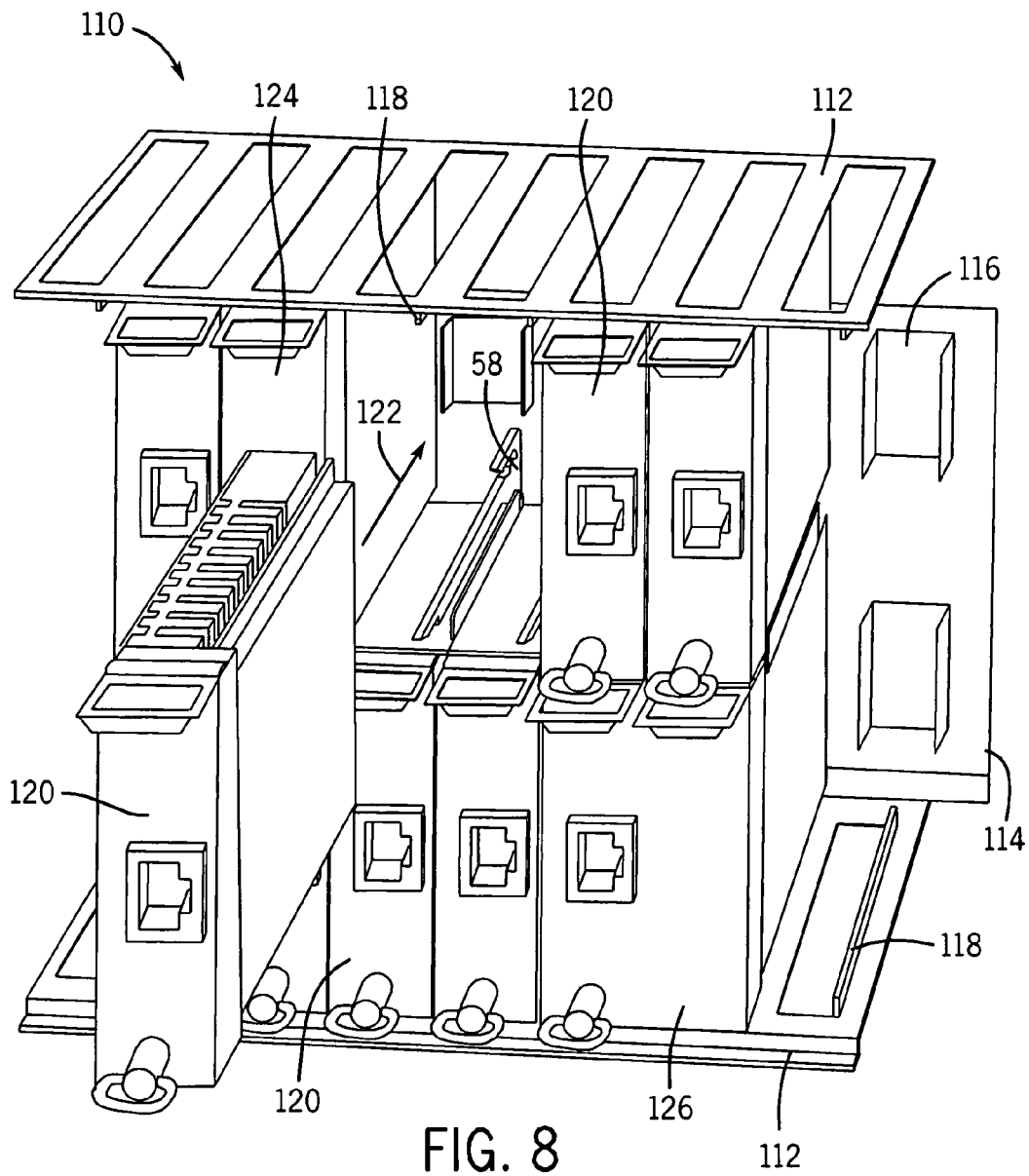
FIG. 8 is a modular cardcage system for housing a plurality of electronic modules in accordance with one embodiment of the present techniques.

Various electronic modules and adapter sleeves may be inserted in a cardcage, such as modular cardcage system 110 illustrated in FIG. 8. Exemplary system 110 includes a housing, chassis, or cardcage 112 for receiving a plurality of electronic modules, which connect to a larger system via a backplane 114. Particularly, backplane 114 includes ports 116 which receive connectors from the electronic modules inserted in cardcage 112. It should be noted that a backplane is a circuit board containing sockets into which other circuit boards can be plugged in, irrespective of the positioning of the backplane within a housing. Cardcage 112 further includes a plurality of guide rails 118 which are configured to cooperate with alignment features of the inserted modules, such as alignment features 46, 48, 52, and 54, as illustrated in FIG. 2.

In one embodiment, the ports 116 are independent from one another, thus allowing for physically independent backplanes to be used as well as facilitating redundancy in the system. For instance, while a full module 124 may include a sixteen-lane link in one embodiment, in an alternative, high-availability embodiment the full module 124 may include a pair of redundant eight-lane links. In this embodiment, each eight-lane link could independently provide power, management, and communication links, thus providing two independent paths from the module to the system such that operation of the module and system will not be substantially affected if one of the links failed.

Cardcage 112 is configured to receive a plurality of full modules 124. Cardcage 112 may also be configured to accept other modules having the same height as full module 124, such as a double-wide full module, having a width that is approximately twice that of full module 124. As discussed above, spacing device 58 facilitates insertion of two base modules 120 in a slot designed for a full module 124 and coupling of base modules 120 to the backplane 114. Similarly, as illustrated, additional spacing devices facilitate insertion of two base modules 120 and one double-wide base module 126, having approximately twice the width of a single base module 120, in two slots designed for full modules 124. Thus, through the use of one or more spacing devices 58, a modular system is achieved that allows insertion of electronic modules of varying height and width into a given system.

Figure 9:
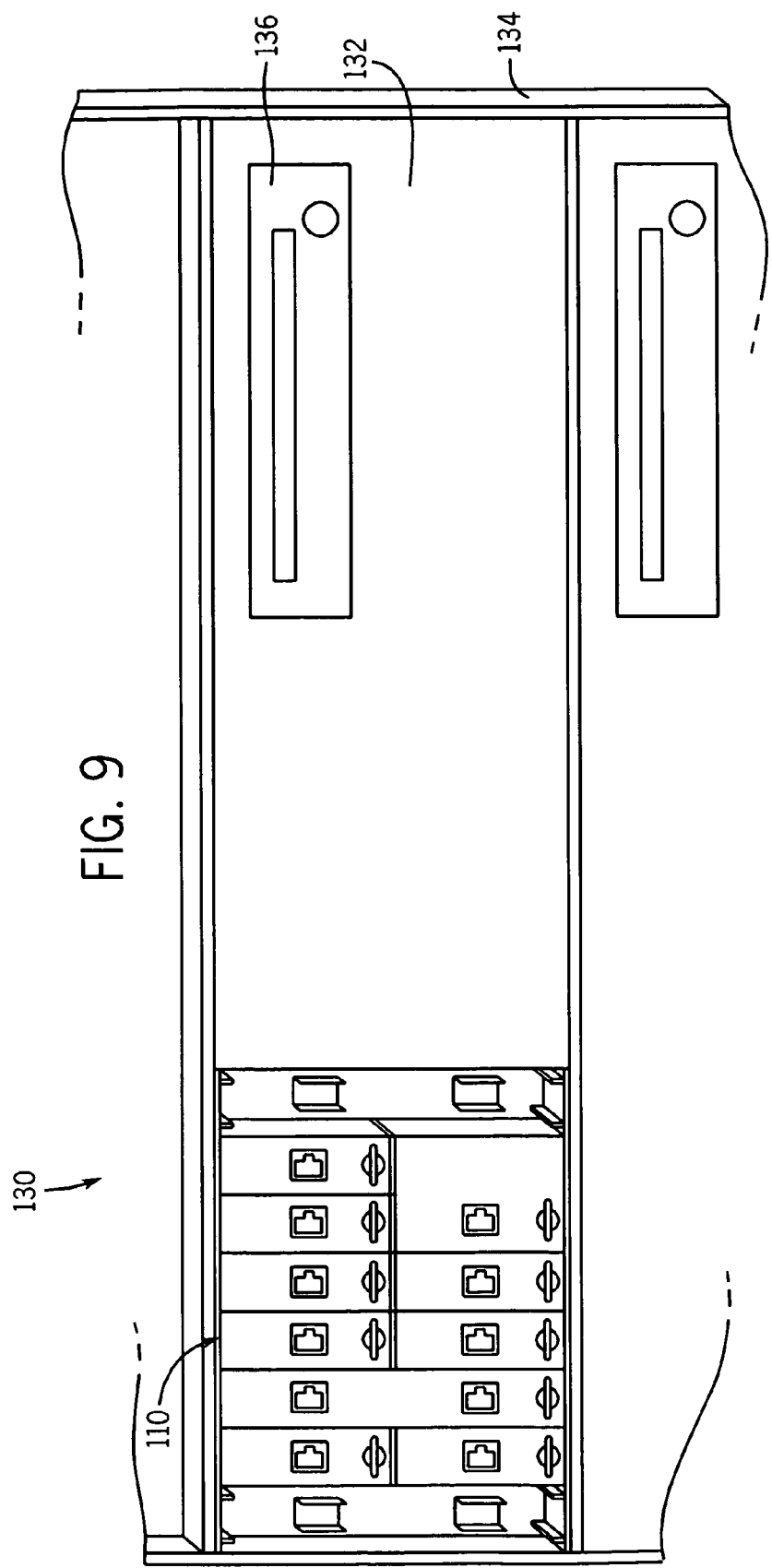
FIG. 9 is an exemplary rack-mounted system including the cardcage of FIG. 8 in accordance with one embodiment of the present techniques.

Notably, exemplary cardcage system 110 may be incorporated into larger electronic systems, such as rack mount system 130 illustrated in FIG. 9. In this particular illustrated embodiment, cardcage system 110 is shown incorporated into a rack mount server 132. As may be appreciated, rack mount server 132 may be inserted into a computing rack 134 and may include a number of peripheral devices, such as a CD-ROM drive 136. Although depicted as a portion of server 132 in the present illustration, it will be appreciated that cardcage system 110 may be incorporated into other systems and devices, including communication extension systems, that may or may not be configured for rack mounting.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A spacing device for a modular system, the device comprising:
    a substantially planar body comprising an upper surface and an opposing lower surface;
    a first guide feature disposed on the upper surface configured to align the body with a mating guide feature of a first electronic module;
    a second guide feature disposed on the lower surface configured to align the body with a mating guide feature of a second electronic module;
    a coupling portion having first and second coupling arms, wherein the first coupling arm releasably couples with the first electronic module to the body and the second coupling arm releasable couples with the second electronic module to the body.

2. The device of claim 1, wherein the first guide feature comprises a first longitudinal guide rib extending from the body.

3. The device of claim 2, wherein the mating guide feature of the first electronic module comprises a groove.

4. The device of claim 2, wherein the second guide feature comprises a second longitudinal guide rib extending from the body.

5. The device of claim 1, wherein the body is configured such that an assembly including the body, the first electronic module, and the second electronic module has a height substantially similar to that of a third electronic module.

6. The device of claim 1, wherein the first coupling arm is configured to secure the first electronic module by receiving a portion of the first electronic module between the first coupling arm and the body.

7. The device of claim 6, wherein the second coupling arm is configured to secure the second electronic module by receiving a portion of the second electronic module between the second coupling arm and the body.

8. The device of claim 1, wherein at least one of the first or second coupling arms includes a tab configured to be received by a notch in the first or second electronic modules, respectively.

9. The device of claim 1, comprising a lateral spacing portion extending from and substantially perpendicular to the body.

10. An electronic system comprising:
    a first electronic component;
    a housing including a slot configured to receive a second electronic component that is larger than the first electronic component;
    a backplane disposed in the housing and configured to connect the second electronic component to other circuitry; and
    a spacing device comprising a substantially planar body and a substantially planar coupling extension perpendicular to the body, wherein the coupling extension includes an alignment guide and a retaining arm removably coupled to the first electronic component, and
    wherein an assembly comprising the spacing device and the first electronic component is configured for insertion in the slot to place the first electronic component in electrical communication with the backplane.

11. The system of claim 10, wherein the assembly further comprises a third electronic component.

12. The system of claim 11, wherein the third electronic component has dimensions substantially similar to those of the first electronic component.

13. The system of claim 10, wherein the housing includes a plurality of slots configured to receive electronic components.

14. The system of claim 10, wherein the first electronic component is a communications module.

15. The system of claim 14, wherein the communications module includes a communications interface on an exterior of the communications module.

16. The system of claim 10, wherein the housing is configured to be mounted in a computing rack.

17. The system of claim 10, wherein the backplane includes a multi-lane connection link that is bifurcatable into two independent links.

18. A method for adaptively coupling an electronic device to a system, the method comprising:
  coupling a first guide rib and a first retaining arm on a first side of a spacing device to a first electronic device;
  coupling a second electronic device to a second guide rib and a second retaining arm on a second side of the spacing device;
  supporting the spacing device between the first electronic device and the second electronic device;
  positioning the spacing device, the first electronic device, and the second electronic device in a slot of a housing of a system, the slot configured to receive a third electronic device having a height greater than or substantially equal to the collective height of the first and second electronic devices.

19. The method of claim 18, wherein coupling the first side of the spacing device to the first electronic device comprises sliding the guide rib within a groove of the first electronic device such that a first end of the first electronic device is positioned intermediate a cantilevered end of the guide rib and a body of the spacing device.

20. The method of claim 19, wherein coupling the first side of the spacing device to the first electronic device comprises sliding the guide rib within the groove of the first electronic device such that a second end of the first electronic device is positioned intermediate the retaining arm and the body of the spacing device.

21. The method of claim 18, wherein positioning the spacing device, the first electronic device, and the second electronic device in a slot of a housing of a system comprises sliding an assembly comprising the spacing device and the first and second electronic devices into the slot such that connectors of the first and second electronic devices engage an electrical backplane of the system.

* * * * *

UNITED STATES PATENT AND TRADEMARK OFFICE
CERTIFICATE OF CORRECTION

PATENT NO. : 7,719,855 B2  Page 1 of 1
APPLICATION NO. : 11/513849
DATED : May 18, 2010
INVENTOR(S) : Stuart Allen Berke et al.

It is certified that error appears in the above-identified patent and that said Letters Patent is hereby corrected as shown below:

In column 6, line 2, in Claim 1, delete "releasable" and insert -- releasably --, therefor.

Signed and Sealed this

Twenty-fourth Day of August, 2010

David J. Kappos
*Director of the United States Patent and Trademark Office*